US012616069B2

(12) United States Patent　　　(10) Patent No.:　US 12,616,069 B2
Lee et al.　　　　　　　　　　　(45) Date of Patent:　　Apr. 28, 2026

(54) DEVICE AND METHOD FOR DETERMINING RANKS OF LIGHT EMITTING DEVICES EACH MOUNTED ON PLURALITY OF RESPECTIVE MOUNTING POINTS ON SUBSTRATE

(71) Applicant: HANWHA PRECISION MACHINERY CO., LTD., Changwon-si (KR)

(72) Inventors: Na Youn Lee, Changwon-si (KR); Jong Il Park, Changwon-si (KR); Jong Eok Ban, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 360 days.

(21) Appl. No.: 18/280,853

(22) PCT Filed: Jun. 23, 2021

(86) PCT No.: PCT/KR2021/007867
§ 371 (c)(1),
(2) Date: Sep. 7, 2023

(87) PCT Pub. No.: WO2022/239904
PCT Pub. Date: Nov. 17, 2022

(65) Prior Publication Data
US 2024/0162202 A1　　May 16, 2024

(30) Foreign Application Priority Data
May 11, 2021　(KR) ........................ 10-2021-0060888

(51) Int. Cl.
*H01L 25/075*　　(2006.01)
(52) U.S. Cl.
CPC ............................... *H01L 25/0753* (2013.01)

(58) Field of Classification Search
CPC ..... H01L 25/0753; H01L 25/075; G02B 6/00; G02B 6/0068; G02F 1/1336; G02F 1/133603; H10H 20/85
See application file for complete search history.

(56) References Cited

U.S. PATENT DOCUMENTS 9,318,034 B2　　4/2016　Shin et al.
9,817,938 B2　　11/2017　Jeevan et al.
(Continued)

FOREIGN PATENT DOCUMENTS

JP　　2012-216862 A　　11/2012
JP　　2015-31894 A　　2/2015
(Continued)

OTHER PUBLICATIONS

International Search Report (PCT/ISA/210) issued by the International Searching Authority on Feb. 9, 2022 in corresponding International Application No. PCT/KR2021/007867.
(Continued)

*Primary Examiner* — Victor A Mandala
(74) *Attorney, Agent, or Firm* — Sughrue Mion, PLLC

(57)　　　　　　ABSTRACT

Provided is a method of determining ranks of a light-emitting devices each mounted at a plurality of respective mounting points on a substrate. The method of determining ranks of light-emitting devices each mounted at a plurality of respective mounting points on a substrate includes obtaining a size of a block including at least one mounting point, and obtaining a number of rank types, determining a number of block group types and a number of mounting points per rank included in an individual block group, determining, by using the number of block group types, arrangements of a plurality of block groups at the plurality of mounting points, and determining the ranks of the light-emitting devices each mounted at the plurality of respective mounting points based
(Continued)

START

OBTAIN SIZE OF BLOCK INCLUDING AT LEAST ONE MOUNTING POINT, AND NUMBER OF RANK TYPES — 901

DETERMINE NUMBER OF BLOCK GROUP TYPES AND NUMBER OF MOUNTING POINTS PER RANK INCLUDED IN INDIVIDUAL BLOCK GROUP, BASED ON SIZE OF BLOCK AND NUMBER OF RANK TYPES — 903

DETERMINE ARRANGEMENTS OF PLURALITY OF BLOCK GROUPS AT PLURALITY OF MOUNTING POINTS BY USING NUMBER OF BLOCK GROUP TYPES — 905

DETERMINE RANKS OF LIGHT-EMITTING DEVICES EACH MOUNTED AT PLURALITY OF RESPECTIVE MOUNTING POINTS BASED ON ARRANGEMENTS OF PLURALITY OF BLOCK GROUPS AND NUMBER OF MOUNTING POINTS PER RANK — 907

END on the arrangements of the plurality of block groups and the number of mounting points per rank.

18 Claims, 9 Drawing Sheets

(56) References Cited

U.S. PATENT DOCUMENTS

| | | | |
|---|---|---|---|
| 10,008,481 B2 | 6/2018 | Yamauchi et al. | |
| 10,629,569 B2 | 4/2020 | Yamauchi et al. | |
| 2007/0047257 A1* | 3/2007 | Yamamoto | G02F 1/133611 |
| | | | 362/613 |
| 2009/0168406 A1* | 7/2009 | Kawasaki | G02F 1/133603 |
| | | | 362/97.3 |
| 2019/0019849 A1* | 1/2019 | Zheng | G02F 1/134336 |
| 2022/0230602 A1* | 7/2022 | Chang | G02F 1/133603 |

FOREIGN PATENT DOCUMENTS

| | | | |
|---|---|---|---|
| JP | 2020-204759 | A | 12/2020 |
| KR | 10-2013-0071806 | A | 7/2013 |
| KR | 10-2015-0107647 | A | 9/2015 |
| KR | 10-2016-0054077 | A | 5/2016 |
| KR | 10-2017-0058538 | A | 5/2017 |
| KR | 10-1886117 | B1 | 8/2018 |

OTHER PUBLICATIONS

Written Opinion (PCT/ISA/237) issued by the International Searching Authority on Feb. 9, 2022 in corresponding International Application No. PCT/KR2021/007867.

* cited by examiner

FIG. 5

DEVICE AND METHOD FOR DETERMINING RANKS OF LIGHT EMITTING DEVICES EACH MOUNTED ON PLURALITY OF RESPECTIVE MOUNTING POINTS ON SUBSTRATE

CROSS REFERENCE TO RELATED APPLICATIONS

This application is a National Stage of International Application No. PCT/KR2021/007867 filed on Jun. 23, 2021 claiming priority from Korean Patent Application No. 10-2021-0060888 filed on May 11, 2021, the entire content of which is incorporated herein by reference.

TECHNICAL FIELD

The present disclosure generally relates to a method of determining ranks of light-emitting devices each mounted at a plurality of respective mounting points on a substrate, and more particularly, to a device for and method of determining ranks of light-emitting devices, each mounted at respective mounting points arranged on a substrate, by using a rank pattern in the unit of a block group.

BACKGROUND ART

As a liquid crystal display is unable to emit light by itself, it forms an image by adjusting the amount of light transmitted from an external source. A backlight unit (BLU) is a lighting device that uniformly transmits light over an entire panel of a liquid crystal display (LCD) that displays an image by constantly adjusting the amount of transmission light.

The BLU is structured such that a plurality of mounting points are arranged in specific rows and columns on a BLU substrate and various parts are respectively connected to the plurality of mounting points. A part connected to a mounting point on the BLU substrate is a light-emitting device of a light source module. Generally, a light emitting diode (LED) is mounted on the BLU. LEDs are effective for video signal streams because they have a high-response speed of several nano seconds, are capable of arbitrarily changing brightness, color temperature, etc. by adjusting the amount of light of red, green, and blue colors, and are suitable for thinning and miniaturization of LCD panels. Thus, LEDs are actively used for most light-emitting devices.

A plurality of light-emitting devices may have different characteristics such as brightness, driving voltages, color coordinates, etc. in a manufacturing process, and according to these characteristics, the plurality of light-emitting devices may have distinguished ranks. When light-emitting devices having the same rank are mounted to partially overlap on a mounted substrate so as to implement a BLU light source module, brightness of an LED board is degraded, causing a stain on the BLU. Consequently, a technique for uniformly distributing light-emitting devices having different ranks on a plurality of mounting points on a BLU connected to light-emitting devices is needed.

DISCLOSURE

Technical Problem

Based on the above discussion, the present disclosure provides a device for and method of determining ranks of light-emitting devices, each mounted at a plurality of respective mounting points on a substrate, by using a random rank pattern.

The present disclosure also provides a device and method to randomly maintain rank arrangements at mounting points of a substrate through rank arrangements in the unit of a block group.

Technical Solution

According to an embodiment of the present disclosure, a method of determining ranks of light-emitting devices each mounted at a plurality of respective mounting points on a substrate includes obtaining a size of a block including at least one mounting point and obtaining a number of rank types, determining a number of block group types and a number of mounting points per rank included in an individual block group, determining, by using the number of block group types, arrangements of a plurality of block groups at the plurality of mounting points, and determining the ranks of the light-emitting devices each mounted at the plurality of respective mounting points based on the arrangements of the plurality of block groups and the number of mounting points per rank.

According to another embodiment, the determining of the number of block group types may include determining a value as the number of block group types such that a remainder of division of a product of the number of mounting points determined from the size of the block and the number of block group types by the number of rank types is 0.

According to another embodiment, the determining of the number of mounting points per rank may include determining, as the number of mounting points per rank, a value obtained by dividing the product of the number of mounting points determined from the size of the block and the number of block group types by the number of rank types, in which a number of mounting points allocated to a first rank in the individual block group is determined such that a difference between the number of mounting points allocated to the first rank and a number of mounting points allocated to ranks other than the first rank is less than a preset first threshold value.

According to another embodiment, the determining of the arrangements of the plurality of block groups may include arranging a first block group at the plurality of mounting points based on a size of the block group and arranging a second block group that is different from the first block group in a block group region adjacent to a region of the first block group.

According to another embodiment, the determining of the ranks of the light-emitting devices each mounted at the plurality of respective mounting points may include allocating, based on the number of rank types, to a light-emitting device corresponding to mounting points at which a corresponding block group is arranged, a rank determined according to a number of remaining mounting points per rank allocatable to the corresponding block group.

According to another embodiment, when the number of rank types is less than or equal to a second threshold value, the allocating of the rank may include allocating the rank by using a rank determined randomly within a number of mounting points per rank of the corresponding block group.

According to another embodiment, when the number of rank types is greater than the second threshold value and is less than or equal to a third threshold value, the allocating of the rank may include allocating a first rank to a light-emitting device corresponding to a first mounting point among the mounting points at which the corresponding block group is arranged, and allocating, to light-emitting devices corresponding to mounting points adjacent to the first mounting point, a rank having a greatest number of remaining mounting points per rank among other ranks different from the first rank.

According to another embodiment, when the number of rank types is greater than the third threshold value, the allocating of the rank may include allocating a first rank to a light-emitting device corresponding to a first mounting point among the mounting points at which the corresponding block group is arranged and allocating, to light-emitting devices corresponding to mounting points adjacent to the first mounting point and mounting points diagonally adjacent to the first mounting point, a rank having a greatest number of remaining mounting points per rank among other ranks different from the rank of the first mounting point.

According to another embodiment, the first block group may include a first sub block group and a second sub block group, and a first rank pattern of mounting points at which the first sub block group is arranged and a second rank pattern of mounting points at which the second sub block group is arranged may be different from each other.

According to an embodiment of the present disclosure, a rank determination device for determining ranks of light-emitting devices each mounted at a plurality of respective mounting points on a substrate includes a controller, in which the controller is configured to determine a number of block group types and a number of mounting points per rank included in an individual block group, determine, by using the number of block group types, arrangements of a plurality of block groups at the plurality of mounting points, and determine the ranks of the light-emitting devices each mounted at the plurality of respective mounting points based on the arrangements of the plurality of block groups and the number of mounting points per rank.

According to another embodiment, the controller may be further configured to determine a value as the number of block group types such that a remainder of division of a product of the number of mounting points determined from the size of the block and the number of block group types by the number of rank types is 0.

According to another embodiment, the controller may be further configured to determine, as the number of mounting points per rank, a value obtained by dividing the product of the number of mounting points determined from the size of the block and the number of block group types by the number of rank types, in which a number of mounting points allocated to a first rank in the individual block group is determined such that a difference between the number of mounting points allocated to the first rank and a number of mounting points allocated to ranks other than the first rank is less than a preset first threshold value.

According to another embodiment, the controller may be further configured to arrange a first block group at the plurality of mounting points based on a size of the block group and arrange a second block group that is different from the first block group in a block group region adjacent to a region of the first block group.

According to another embodiment, the controller may be further configured to allocate, based on the number of rank types, to a light-emitting device corresponding to mounting points at which a corresponding block group is arranged, a rank determined according to a number of remaining mounting points per rank allocatable to the corresponding block group.

According to another embodiment, when the number of rank types is less than or equal to a second threshold value, the controller may be further configured to allocate the rank by using a rank determined randomly within a number of mounting points per rank of the corresponding block group.

According to another embodiment, when the number of rank types is greater than the second threshold value and is less than or equal to a third threshold value, the controller may be further configured to allocate a first rank to a light-emitting device corresponding to a first mounting point among the mounting points at which the corresponding block group is arranged and allocate, to light-emitting devices corresponding to mounting points adjacent to the first mounting point, a rank having a greatest number of remaining mounting points per rank among other ranks different from the first rank.

According to another embodiment, when the number of rank types is greater than the third threshold value, the controller may be further configured to allocate a first rank to a light-emitting device corresponding to a first mounting point among the mounting points at which the corresponding block group is arranged and allocate, to light-emitting devices corresponding to mounting points adjacent to the first mounting point and mounting points diagonally adjacent to the first mounting point, a rank having a greatest number of remaining mounting points per rank among other ranks different from the rank of the first mounting point.

According to another embodiment, the first block group may include a first sub block group and a second sub block group, and a first rank pattern of mounting points at which the first sub block group is arranged and a second rank pattern of mounting points at which the second sub block group is arranged may be different from each other.

Each of various aspects and features of the present disclosure is defined in the appended claims. Combinations of features of dependent claims may be properly combined with features of independent claims as well as those explicitly set forth in the claims.

Furthermore, one or more selected features of any one embodiment described in the present disclosure may be combined with one or more selected features of any other embodiment described herein, provided that the alternative combination of features at least partially alleviates the one or more technical problem discussed in the present disclosure or at least partially alleviates a technical problem discernable by those of ordinary skill in the art from the present disclosure and further provided that a particular combination or permutation of embodiment features thus formed would not be understood by those of ordinary skill in the art to be incompatible.

Two or more physically distinct components in any described example implementation of the present disclosure may be alternatively integrated into a single component where possible, provided that the same function is performed by the single component thus formed. Conversely, a single component of any embodiment described in the present disclosure may be alternatively implemented as two or more distinct components to achieve the same function, where appropriate.

It is an aim of certain embodiments of the present disclosure to solve, mitigate, or obviate, at least partly, at least one of the problems and/or disadvantages associated with the prior art. Certain embodiments aim to provide at least one of advantages described below.

Advantageous Effects

A device and method according to various embodiments of the present disclosure may determine ranks of light-emitting devices to be uniformly distributed at mounting points on a BLUE substrate by using a rank pattern in the unit of a block group.

Effects obtainable in the disclosure are not limited to the effects mentioned above, and other effects not mentioned above may be clearly understood by those of ordinary skill in the art from the following description.

DESCRIPTION OF DRAWINGS

FIG. 5 shows an example of a result of arrangement of a block group, in a rank determination system according to various embodiments of the present disclosure.

BEST MODE

Figure 1:
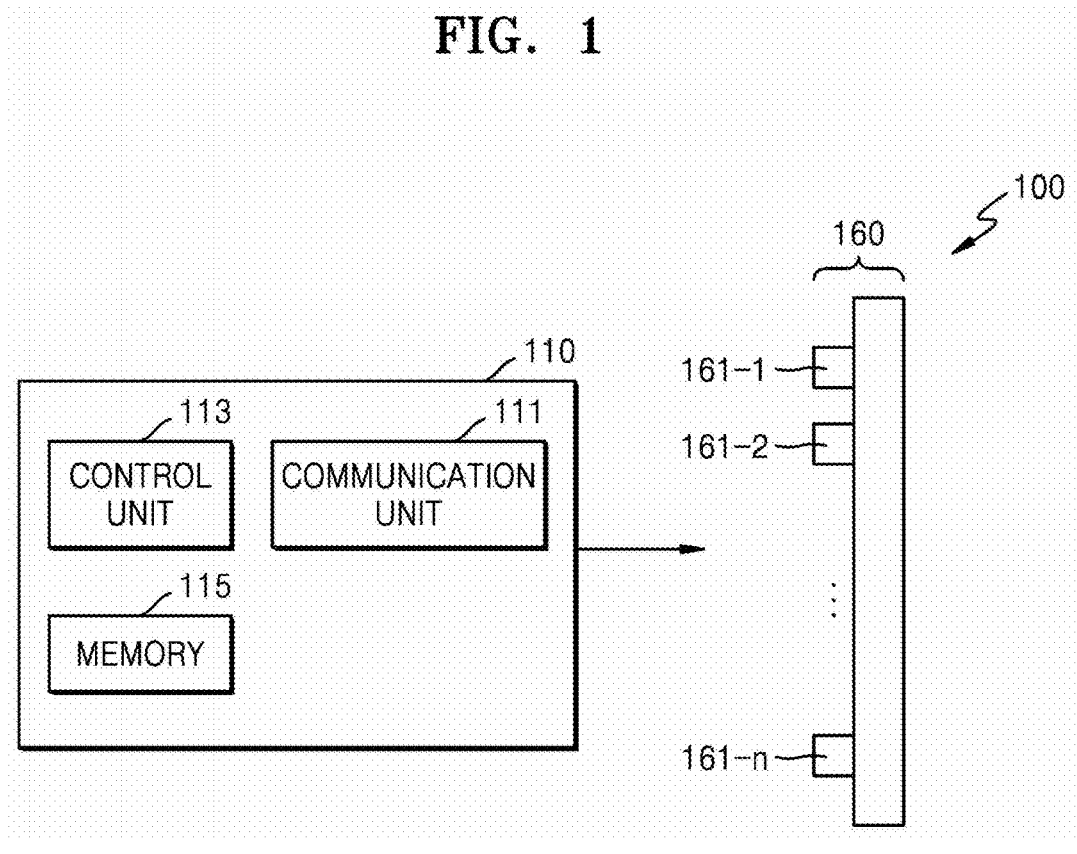
FIG. 1 shows a rank determination system according to various embodiments of the present disclosure.

The terms used herein are used only for describing specific examples and are not intended to limit the scope of other examples. It is to be understood that the singular forms include plural references unless the context clearly dictates otherwise. All terms including technical or scientific terms used herein have the same meaning as commonly understood by those of ordinary skill in the art described herein. It will be further understood that among terms used herein, terms defined in commonly used dictionaries may be interpreted as a meaning that is identical to or similar with their meanings in the context of the relevant art and will not be interpreted in an idealized or overly formal sense unless expressly so defined herein. In some cases, the terms defined herein may not be interpreted to exclude examples of the disclosure.

In various examples of the disclosure described below, a hardware approach will be described as an example. However, various examples of the present disclosure include technology using both hardware and software, and thus do not exclude a software-based approach.

The present disclosure relates to a device and method for determining ranks of light-emitting devices each mounted at respective mounting devices arranged on a substrate, in a rank determination system. More specifically, the present disclosure describes a technique for determining ranks to be uniformly distributed at mounting points by using a rank pattern in the unit of a block group.

Hereinafter, various embodiments of the present disclosure will be described in detail with reference to the attached drawings to allow those of ordinary skill in the art to easily carry out the examples of the disclosure. However, the technical spirit of the present disclosure may not be limited to the embodiments described herein because it may be transformed into various forms and implemented. In the description of the examples disclosed herein, the detailed description of the related known technology will be omitted when it is determined to obscure the subject matter of the technical spirit of the present disclosure. Identical or similar components will be given identical reference numerals and will not be repeatedly described.

Throughout the specification, when a component is "connected" to another component, it may include not only a case where they are "directly connected", but also a case where they are "indirectly connected" with another component therebetween. When an element is referred to as "includes" another component, it may mean that the component may further include still another component rather than excluding the still another component unless stated otherwise.

Some examples may be described with functional block configurations and various processing operations. Some or all of the functional blocks may be implemented with various numbers of hardware and/or software configurations. For example, the functional blocks of the present disclosure may be implemented by one or more microprocessors or circuit configurations for certain functions. The functional blocks of the present disclosure may be implemented with various programming or scripting languages. The functional blocks of the present disclosure may be implemented as an algorithm executed on one or more processors. A function performed by a functional block of the present disclosure may be performed by a plurality of functional blocks, or functions performed by a plurality of functional blocks may be performed by one functional block in the present disclosure. Moreover, the present disclosure may employ related art for electronic environment setting, signal processing, and/or data processing, etc.

In the present disclosure, to determine whether a certain condition is satisfied or fulfilled, an expression of 'exceed' or 'less than' has been used, but this is merely a description for expressing an example without excluding an expression of 'greater than or equal to' or 'less than or equal to'. A condition described as 'greater than or equal to' may be replaced with 'exceed', a condition described as 'less than or equal to' may be replaced with 'less than', and a condition described as 'greater than or equal to and less than' may be replaced with 'exceed and less than or equal to'.

The term used herein such as ' . . . unit' or ' . . . module' indicates a unit for processing at least one function or operation, and may be implemented in hardware, software, or in a combination of hardware and software.

FIG. 1 shows a rank determination system 100 according to various embodiments of the present disclosure. Referring to FIG. 1, the rank determination system 100 may include a production line 160, mounting devices 161-1 to 161-*n* provided on a substrate production line, and a rank determination device 110 that determines a rank of a light-emitting device mounted on a substrate by a mounting device. A configuration of the rank determination system 100 is an example, and the number of mounting devices 161-1 to 161-n included in the system is not limited to the number shown in FIG. 1.

According to the present disclosure, the substrate may indicate an electronic substrate on which chip mounting may be performed by the mounting devices 161-1 to 161-n. For example, the substrate may be a light emitting diode (LED) substrate and may mean a substrate on which a plurality of LED chips are to be mounted. Thus, a light-emitting device to be mounted on the substrate described later may include an LED.

The LED may have a rank distinguished according to the amount of light, a color temperature, and a driving voltage. That is, LEDs, even having substantially the same appearance, may have rank values formed uncontrollably in a manufacturing process. In response, the rank determination device 110 may determine rank arrangements such that LEDs having distinguished ranks are uniformly distributed on the BLU substrate.

The mounting devices 161-1 to 161-n may perform a mounting operation of adsorbing a light-emitting device at a preset position and mounting the adsorbed light-emitting device on a board at another preset position. According to an embodiment of the present disclosure, a control device of a mounting device among components of the mounting devices 161-1 to 161-n may mount a light-emitting device on a BLU substrate to correspond to a rank determined by the rank determination device 110 described below. The plurality of mounting points may perform a function to connect a light-emitting device to a substrate. The plurality of mounting points may be arranged to form specific rows and columns on the substrate. Herein, a light-emitting device may indicate a light-emitting device of a light source module and may include an LED.

The rank determination apparatus 110 may perform a function to determine ranks of light-emitting devices each mounted at the plurality of respective mounting points of the mounting devices 161-1 to 161-n. Referring to FIG. 1, the rank determination device 110 may include a communication unit 111, a control unit 113, and a memory 115. Although not shown in the drawings, the rank determination apparatus 110 according to an embodiment of the present disclosure may further include an input/output unit, a program storing unit, etc.

The communication unit 111 may perform functions for transmitting and receiving a signal through a wired or wireless channel. According to an embodiment of the present disclosure, the communication unit 111 may indicate a device including hardware and software required for the rank determination device 110 to transmit and receive a signal such as a control signal or a data signal through wired/wireless connection with at least one of other devices such as the mounting devices 161-1 to 161-n and a user terminal (not shown).

The control unit 113 may include any type of device capable of processing data, such as a processor. Herein, the 'processor' may mean, for example, a data processing device embedded in hardware, which has a physically structured circuit to perform a function represented as a code or a command included in a program. Examples of the data processing device embedded in hardware may include a microprocessor, a central processing unit (CPU), a processor core, a multiprocessor, an application-specific integrated circuit (ASIC), a field programmable gate array (FPGA), and so forth, but the scope of the present disclosure is not limited thereto.

The memory 115 may perform a function to temporarily or permanently store data processed by the rank determination device 110. For example, the memory 115 may temporarily or permanently store block group type information, block group arrangement information, rank arrangement information in a block group, etc., for a plurality of mounting points. The memory 115 may include a magnetic storage media or a flash storage media, but the scope of the present disclosure is not limited thereto.

The rank determination device 110 may determine ranks of light-emitting devices each mounted at a plurality of respective mounting points by using a random pattern algorithm considering characteristics of a BLU substrate where a plurality of LEDs are arranged in series and in parallel. According to an embodiment of the present disclosure, to mount light-emitting devices of various ranks on the BLU substrate, a technique for generating a random pattern to minimize redundant arrangements of the same rank between a mounting point and an adjacent mounting point thereto on the BLU substrate may be used. In particular, the rank determination device 110 may control all rank arrangements per block to be maintained randomly, such that ranks may be uniformly distributed over the mounting points of the entire BLU to express colors evenly.

According to an embodiment of the present disclosure, a random pattern generated by the block circuit may be determined to satisfy two conditions. The first condition may include a condition that ranks do not overlap in a boundary between blocks. Among a plurality of mounting points arranged in one block, adjacent mounting points having the same rank may be determined not to adjoin each other. In a boundary between adjacent mounting points, mounting points having the same rank may be determined not to adjoin each other. The second condition may include a condition that the number of mounting points allocated for each rank in a block is the same. However, when the same number of rank arrangements in one block is not possible, a sum of the numbers of mounting points allocated per rank including an adjacent block thereto is the same. In this case, the adjacent block to the one block may include at least one of a block adjacent on an X-axis and a block adjacent on a Y-axis.

According to an embodiment of the present disclosure, the control unit 113 may obtain information about a substrate to be produced. The obtained information may include identification information of the substrate, coordinates of a plurality of mounting points, etc. According to an embodiment of the present disclosure, the control unit 113 may obtain the information by retrieving such board information from the memory 115 or receiving the information from an external device (not shown) through the communication unit 111.

According to an embodiment of the present disclosure, the control unit 113 may determine a direction in which light-emitting devices are arranged on the substrate as one of a first direction and a second direction, based on coordinates of the plurality of mounting points 161-1 to 161-n arranged on the substrate. The first direction and the second direction may be orthogonal to each other. For example, on an X-Y coordinate system, the first direction may indicate an X direction, and the second direction may indicate a Y direction.

Figure 2:
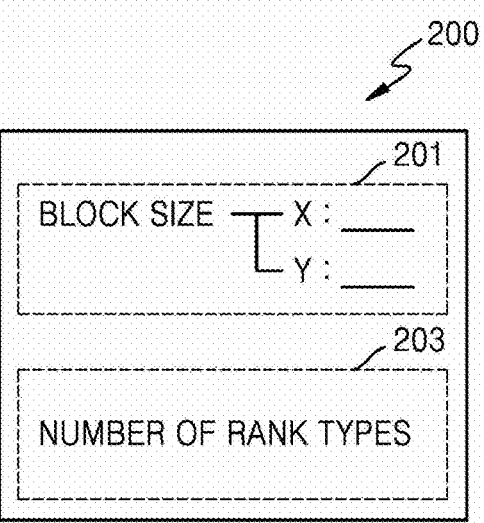
FIG. 2 is a schematic diagram of a method used by a rank determination device to receive information, in a rank determination system according to various embodiments of the present disclosure.

FIG. 2 is a schematic diagram of a method for the rank determination device 110 to receive information, in a rank determination system 200 according to various embodiments of the present disclosure. Referring to FIG. 2, the control unit 113 of the rank determination device 110 may perform a function to obtain information for determining information.

The control unit 113 may obtain input information directly from a user or from an external device, or the memory 115 of the rank determination device 110. The input information may include information about the size of a block and the number of rank types.

According to an embodiment of the present disclosure, the rank determination device 110 may obtain a size of a block (a block size) 201 and the number of rank types (a rank type number) 203 by using at least one of the control unit 113, the communication unit 111, and the memory 115. The rank determination device 110 may receive all of a block size and a rank type number from the user or receive the block size from the user and use a rank type number previously stored in the memory 115 to determine a rank of a memory mounted at each of a plurality of mounting points. According to an embodiment of the present disclosure, the block size 201 may include the number of X-axis mounting points and the number of Y-axis mounting points at the plurality of mounting points. Hereinbelow, the block size may be described as (the number of X-axis mounting points, the number of Y-axis mounting points). The rank type number 203 may mean the number of rank types determined based on at least one of the amount of light of an LED, a color temperature, and a driving voltage.

According to an embodiment of the present disclosure, the control unit 113 may directly receive the block size 201 and the rank type number 203 from the user. In this case, the rank determination device 110 may further include a display unit for receiving and displaying input information. The user may input the number of X-axis mounting points, the number of Y-axis mounting points, and the number of rank types of a block to the rank determination device 110 through the display unit. According to an embodiment of the present disclosure, the display unit may include a display panel to which an input is made through a user's touch.

According to an embodiment of the present disclosure, the user may input information including a block size of (3, 2) and a rank type number of 4, as shown in FIG. 2.

Figure 3:
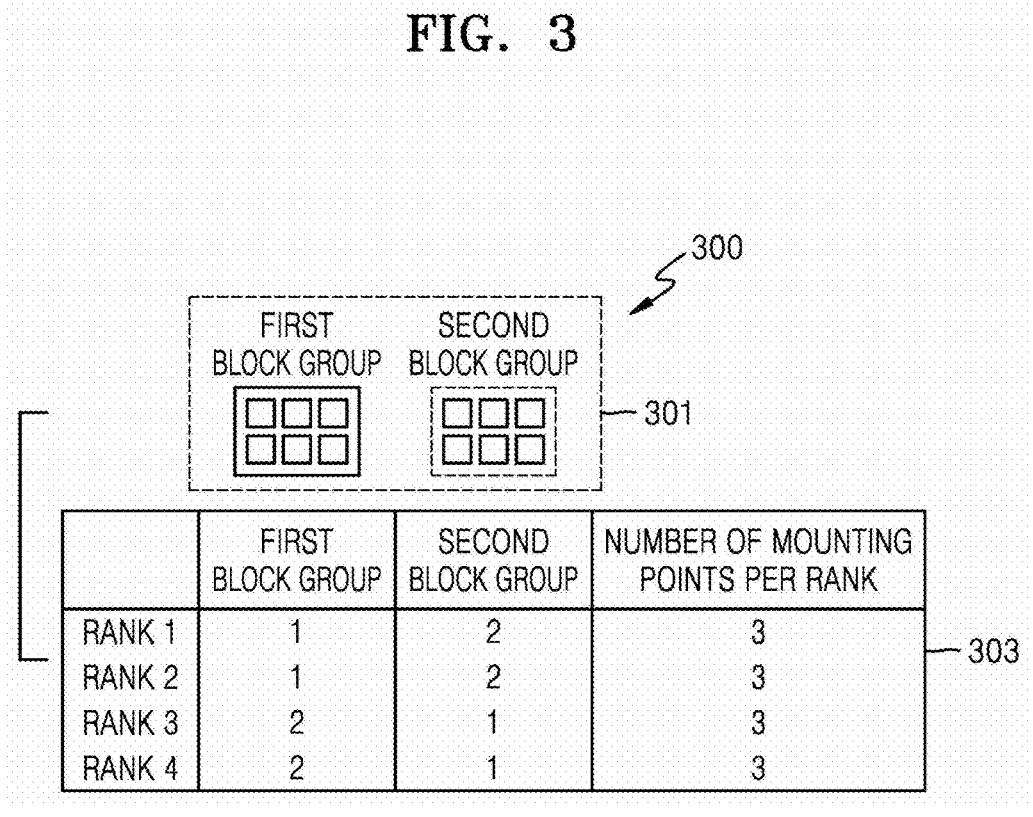
FIG. 3 is a schematic diagram of a method used by a rank determination device to determine a block group type, in a rank determination system according to various embodiments of the present disclosure.

FIG. 3 is a schematic diagram 300 of a method for the rank determination device 100 to determine a block group type, in a rank determination system according to various embodiments of the present disclosure.

The control unit 113 may determine the number of block group types and the number of mounting points per rank included in an individual block group, by using a block size and a rank type number. The control unit 113 may determine the number of block group types and the number of mounting points per rank in an individual block group by using the number of X-axis mounting points, the number of Y-axis mounting points, and the number of rank types of a block. A block group may mean a group of blocks having the same block size and the same number of mounting points per rank. According to an embodiment of the present disclosure, a size of one block may be determined from an input block size. Herein, blocks having the same number of mounting points per rank may be classified as the same block group. As the number of mounting points per rank needs to be the same in each block group, the number of block group types may be determined as a value that causes a product of the number of block group types and the number of mounting points in a block to be evenly divided by the number of rank types. The number of mounting points per rank may be divided by the same number in the entire block group such that rans are evenly divided in one block. Thus, the number of mounting points per rank may be determined as a value obtained by dividing the product of the number of block group types and the number of mounting points in a block by the number of rank types. The number of ranks allocated in one block group may be distributed as evenly as possible. That is, the number of mounting points allocated to a rank in an individual block group may be determined such that a difference between the number of mounting points allocated to the corresponding rank and the number of mounting points allocated to the other rank than the corresponding rank is less than a preset threshold value.

For example, when a block size is (4, 3), the number of block group types and the number of mounting points per rank based on a rank type number may be determined as in Table 1.

TABLE 1

| Number of Rank Types | Number of Block Groups | Number of Mounting Points per Rank |
|---|---|---|
| 3 | 1 | $(1 \times 12)/3 = 4$ |
| 6 | 1 | $(1 \times 12)/6 = 2$ |
| 8 | 2 | $(2 \times 12)/8 = 3$ |
| 5 | 5 | $(5 \times 12)/5 = 12$ |

Referring to <Table 1>, assuming that the number of total mounting points in one block is 12, when a rank type number is 3, 4 groups of rank type number 3 may be allocated to one block group of 12 mounting points in total. For a rank type number of 6, 2 groups of rank type number 6 may be allocated to one block group of 12 mounting points in total. For a rank type number of 8, 3 groups of rank type number 8, may be allocated to two block groups of 24 mounting points in total. In this case, 12 mounting points out of the 24 mounting points may be allocated to each block group. For a rank type number of 5, in the case of a total of 60 mounting points of rank type number of 5, 5 block groups of 12 mounting points may be obtained. In this case, 12 mounting points out of the 60 mounting points may be allocated to each block group.

As shown in FIG. 3, when a block size is (3, 2) and a rank type number is 4, the control unit 113 may determine the number of block group types (a block group type number) 301 as 2 and the number of mounting points (a mounting point number) 303 as 3. More specifically, the control unit 113 may determine the number of mounting points per rank as 3 by dividing a product of the number of block group types and the number of mounting points in a block by the number of rank types. Moreover, in a first block group and a second block group, ranks may be distributed evenly as much as possible. Referring to FIG. 3, in the first block group, mounting point numbers respectively allocated to ranks 1 to 4 may be determined as 1, 1, 2, and 2, respectively. In the second block group, mounting point numbers respectively allocated to ranks 1 to 4 may be determined as 2, 2, 1, and 1, respectively.

Figure 4:
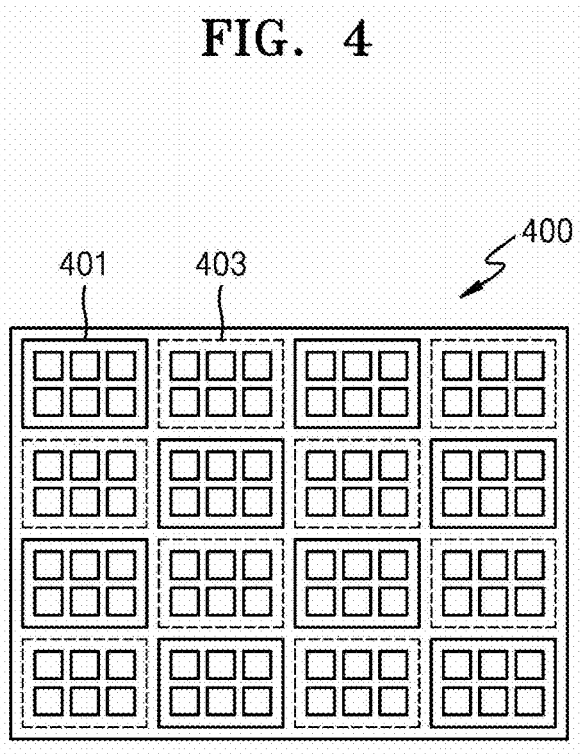
FIG. 4 is a schematic diagram of a method used by a rank determination device to determine block group arrangements, in a rank determination system according to various embodiments of the present disclosure.

FIG. 4 is a schematic diagram 400 of a method for the rank determination device 100 to determine block group arrangement, in a rank determination system according to various embodiments of the present disclosure.

Referring to FIG. 4, the control unit 113 may determine arrangements of a plurality of block groups at a plurality of mounting points. More specifically, the control unit 113 may determine information about arrangement of a block group by using the number of block group types. A plurality of blocks may be classified as a plurality of block groups based on the number of types of the plurality of block groups. Correspondingly, the control unit 113 may arrange the plurality of block groups in numerical order. According to an embodiment of the present disclosure, numbers of block groups may be arranged crossing each other up, down, left, and right.

As shown in FIG. 4, when a block size is (3, 2) and a block group type number is 2, the control unit 113 may arrange a first block group 401 at the upper left of the plurality of mounting points and a second block group 403 in a block group region adjacent to the first block group 401.

Referring to FIG. 4, when a block size and a rank type number are input, the control unit 113 may determine types of block groups and the number of mounting points per rank to determine arrangements of the block groups and the number of mounting points allocated per rank in each block group. An example of a result of arrangements of a plurality of block groups is shown in FIG. 5.

Figure 5:
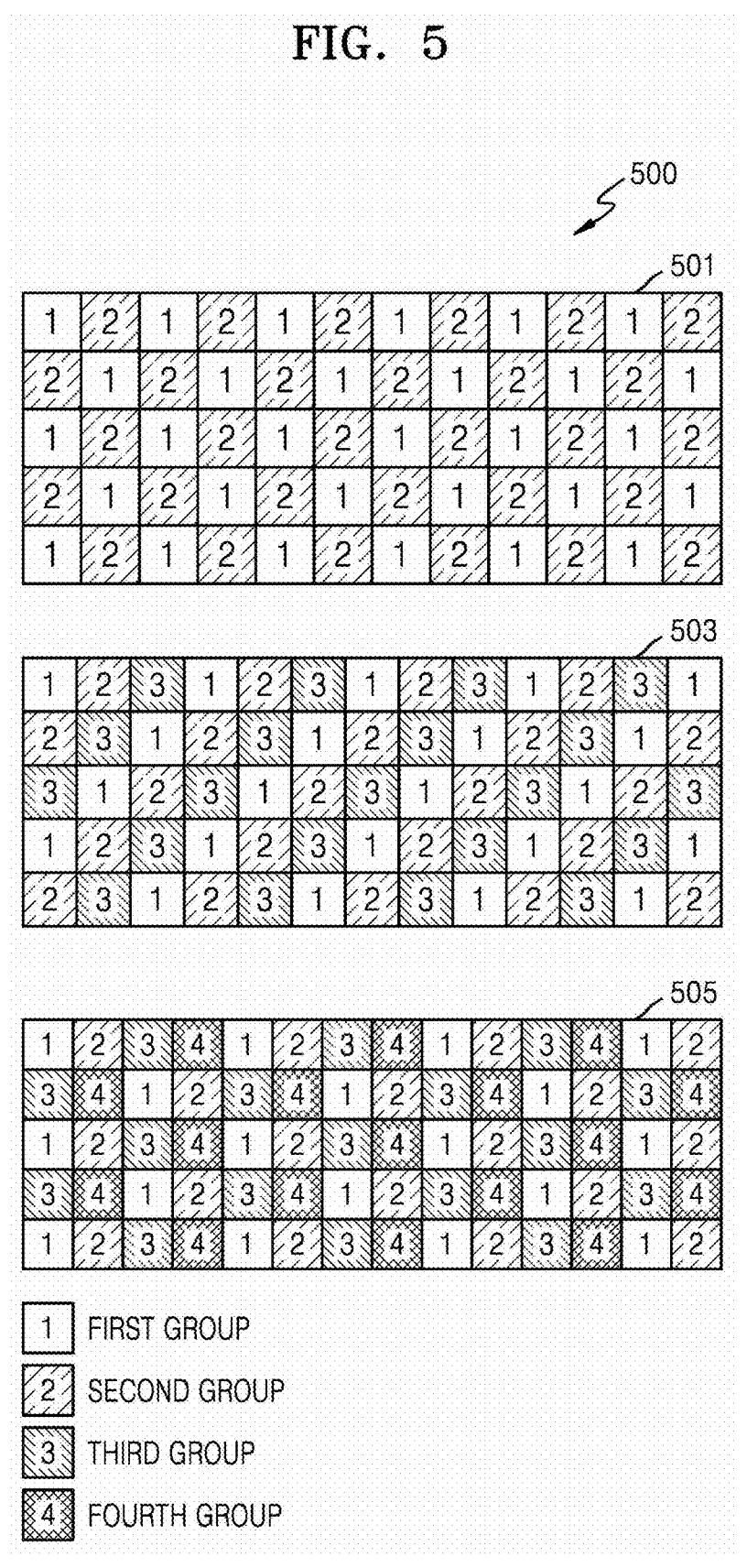

FIG. 5 shows an example 500 of a result of arrangement of a block group, in a rank determination system according to various embodiments of the present disclosure. FIG. 5 shows a result in which the rank determination device 110 determines and arranges a block group, in a rank determination system according to various embodiments of the present disclosure.

Referring to FIG. 5, a block group arrangement result 501 for a block group type number of 2, a block group arrangement result 503 for a block group type number of 3, and a block group arrangement result 505 for a block group type number of 4 are shown.

According to an example, for a block size of (3, 3) and a rank type number of 6, the rank determination device 110 may arrange block groups as in the block group arrangement result 501. More specifically, the rank determination device 110 may determine the number of block group types and the number of mounting points per rank as shown in Table 2.

TABLE 2

| | |
|---|---|
| Number of Mounting Points | 3 × 3 = 9 |
| Number of Block Group Types | 2 |
| Number of Mounting Points Included in Total Block Groups | 9 × 2 = 18 |
| Number of Rank Types | 6 |
| Number of Mounting Points per Rank | 3 |

Referring to Table 2, the number of block group types may be determined as 2 and the number of mounting points per rank may be determined as 3. As the number of block group types is 2, blocks may be classified as a first block group and a second block group, and the number of ranks allocated to each of the first block group and the second block group may be determined as shown in Table 3 such that ranks are distributed as evenly as possible.

TABLE 3

| | First Block Group | Second Block Group | Number of Mounting Points per Rank |
|---|---|---|---|
| Rank 1 | 2 | 1 | 3 |
| Rank 2 | 2 | 1 | 3 |
| Rank 3 | 2 | 1 | 3 |
| Rank 4 | 1 | 2 | 3 |

TABLE 3-continued

| | First Block Group | Second Block Group | Number of Mounting Points per Rank |
|---|---|---|---|
| Rank 5 | 1 | 2 | 3 |
| Rank 6 | 1 | 2 | 3 |

The number of mounting points allocated to each rank in the first block group and the second block group may be determined as shown in Table 3. That is, the number of mounting points allocated to a rank in an individual block group may be determined such that a difference between the number of mounting points allocated to the corresponding rank and the number of mounting points allocated to the other rank than the corresponding rank is less than a preset threshold value.

According to an example, for a block size of (2, 5) and a rank type number of 3, the rank determination device 110 may arrange block groups as in the block group arrangement result 503. More specifically, the rank determination device 110 may determine the number of block group types and the number of mounting points per rank as shown in Table 4.

TABLE 4

| | |
|---|---|
| Number of Mounting Points | 2 × 5 = 10 |
| Number of Block Group Types | 3 |
| Number of Mounting Points Included in Total Block Groups | 10 × 3 = 30 |
| Number of Rank Types | 3 |
| Number of Mounting Points per Rank | 10 |

Referring to Table 4, the number of block group types may be determined as 3 and the number of mounting points per rank may be determined as 10. As the number of block group types is 3, blocks may be classified as a first block group to a third block group, and the number of ranks allocated to each of the first block group to the third block group may be determined as shown in Table 5 such that ranks are distributed as evenly as possible.

TABLE 5

| | First Block Group | Second Block Group | Third Block Group | Number of Mounting Points per Rank |
|---|---|---|---|---|
| Rank 1 | 4 | 3 | 3 | 10 |
| Rank 2 | 3 | 3 | 4 | 10 |
| Rank 3 | 3 | 4 | 3 | 10 |

The number of mounting points allocated to each rank in the first block group to the third block group may be determined as shown in Table 5. That is, the number of mounting points allocated to a rank in an individual block group may be determined such that a difference between the number of mounting points allocated to the corresponding rank and the number of mounting points allocated to the other rank than the corresponding rank is less than a preset threshold value.

According to an example, for a block size of (3, 5) and a rank type number of 4, the rank determination device 110 may arrange block groups as in the block group arrangement result 505. More specifically, the rank determination device 110 may determine the number of block group types and the number of mounting points per rank as shown in Table 6.

TABLE 6

| Number of Mounting Points | 3 × 5 = 15 |
|---|---|
| Number of Block Group Types | 4 |
| Number of Mounting Points Included in Total Block Groups | 15 × 4 = 60 |
| Number of Rank Types | 4 |
| Number of Mounting Points per Rank | 15 |

Referring to Table 6, the number of block group types may be determined as 4 and the number of mounting points per rank may be determined as 15. As the number of block group types is 4, blocks may be classified as a first block group to a fourth block group, and the number of ranks allocated to each of the first block group to the fourth block group may be determined as shown in Table 7 such that ranks are distributed as evenly as possible.

TABLE 7

| | First Block Group | Second Block Group | Third Block Group | Fourth Block Group | Number of Mounting Points per Rank |
|---|---|---|---|---|---|
| Rank 1 | 4 | 4 | 4 | 3 | 15 |
| Rank 2 | 4 | 4 | 3 | 4 | 15 |
| Rank 3 | 3 | 4 | 4 | 4 | 15 |
| Rank 4 | 4 | 3 | 4 | 4 | 15 |

The number of mounting points allocated to each rank in the first block group to the fourth block group may be determined as shown in Table 7. That is, the number of mounting points allocated to a rank in an individual block group may be determined such that a difference between the number of mounting points allocated to the corresponding rank and the number of mounting points allocated to the other rank than the corresponding rank is less than a preset threshold value.

Figure 6:
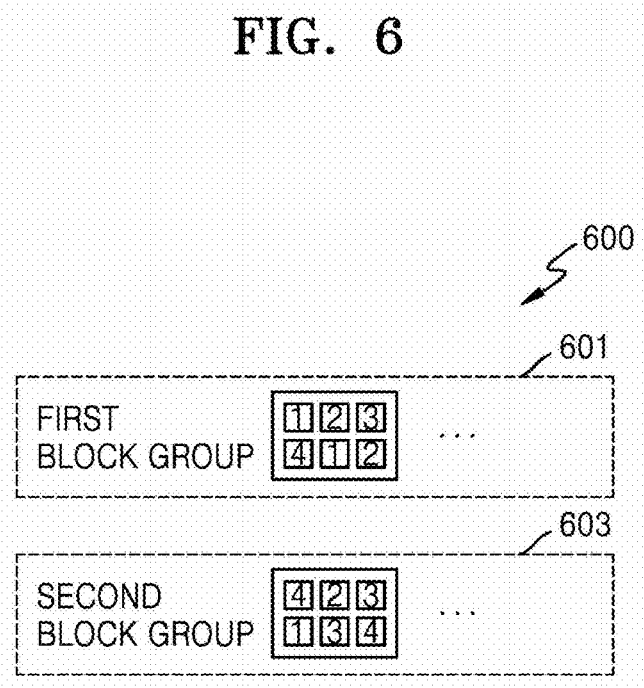
FIG. 6 is a schematic diagram of a method used by a rank determination device to determine a rank pattern, in a rank determination system according to various embodiments of the present disclosure.

FIG. 6 is a schematic diagram 600 of a method for the rank determination device 100 to determine a rank pattern, in a rank determination system according to various embodiments of the present disclosure.

The control unit 113 may perform a function to determine a rank pattern for a plurality of mounting points included in a block group. The control unit 113 may determine a rank pattern for a plurality of block groups based on the number of mounting points per rank. The control unit 113 may identify the number of mounting points allocated to each rank based on the number of mounting points per rank corresponding to one block group, and allocate ranks to mounting points within the number of mounting points allocated to each rank.

For example, for a block size of (3, 2) and a rank type number of 4, the number of block group types may be determined as 2 and the number of mounting points per rank may be determined as 3. In the first block group, mounting point numbers respectively allocated to ranks 1 to 4 may be determined as 1, 1, 2, and 2, respectively. Correspondingly, the control unit 113 may determine a rank pattern 601 having an order of 1, 2, 3, 4, 1, and 2 to 6 mounting points in the first block group. In the second block group, mounting point numbers respectively allocated to ranks 1 to 4 may be determined as 2, 2, 1, and 1, respectively. Correspondingly, the control unit 113 may determine a rank pattern 603 having an order of 4, 2, 3, 1, 3, and 4 to 6 mounting points in the second block group.

Herein, the rank pattern 601 of the first block group may be determined in such an order that the same rank is not given to adjacent mounting points, other than the order of 1, 2, 3, 4, 1, and 2. The rank pattern 603 of the second block group may also be determined in such an order that the same rank is not given to adjacent mounting points, other than the order of 4, 2, 3, 1, 3, and 4. That is, a rank pattern determined in one block group may be determined to be different within a range not exceeding the number of mounting points allocated to each rank. According to an embodiment of the present disclosure, one block group may include a first sub block group and a second sub block group in which a first rank pattern for mounting points at which the first sub block group is arranged and a second rank pattern for mounting points at which the second sub block group is arranged may be different from each other.

Figure 7:
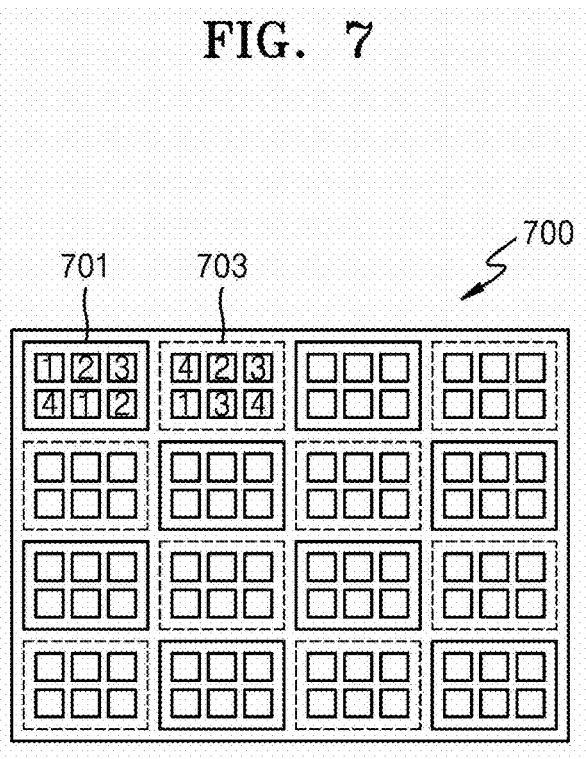
FIG. 7 is a schematic diagram of a method used by a rank determination device to determine a rank of a light-emitting device, in a rank determination system according to various embodiments of the present disclosure.

FIG. 7 is a schematic diagram 700 of a method for the rank determination device 100 to determine a rank of a light-emitting device, in a rank determination system according to various embodiments of the present disclosure.

The control unit 113 may perform a function to determine ranks of light-emitting devices each mounted at a plurality of respective mounting points of a substrate, by using a rank pattern. The control unit 113 may determine ranks of light-emitting devices each mounted at a plurality of respective mounting points arranged on a BLU substrate, by using arrangements of a plurality of block groups and a rank pattern determined based on the number of mounting points per rank.

The control unit 113 may determine ranks of light-emitting devices each mounted at the plurality of respective mounting points, by using the determined arrangements of the block groups and the rank patterns per block group.

For example, when a rank pattern 701 of an order of 1, 2, 3, 4, 1, and 2 is determined in the first block group and a rank pattern 703 of an order of 4, 2, 3, 1, 3, and 4 is determined in the second block group, the control unit 113 may determine a rank pattern corresponding to the plurality of mounting points by using the arrangements of the plurality of block groups.

The control unit 113 may determine a rank based on the number of rank types. According to an embodiment of the present disclosure, the control unit 113 may determine a rank pattern by using a rank determined randomly from among the remaining mounting points per rank, when the number of rank types is 2.

According to another embodiment of the present disclosure, when the number of rank types is greater than or equal to 3 and less than 6, the control unit 113 may allocate, to mounting points adjacent to one of mounting points at which a corresponding block group is arranged, a rank having the greatest number of remaining mounting points per rank among the other ranks different from the rank of the corresponding mounting point. That is, the control unit 113 may allocate, to one mounting point, a random rank that is not redundant to four mounting points adjacent to the one mounting point up, down, left, and right, and allocate, to the adjacent mounting points, a rank having the greatest number of remaining mounting points per rank among non-redundant ranks.

According to another embodiment of the present disclosure, when the number of rank types is greater than or equal to 6, the control unit 113 may allocate, to the mounting points adjacent to one mounting point and mounting points diagonally adjacent to the one mounting point, a rank having the greatest number of remaining mounting points per rank among the other ranks different from the rank of the one mounting point. That is, the control unit 113 may allocate, to one mounting point, a random rank that is not redundant to eight mounting points adjacent to the one mounting point up, down, left, and right or diagonally, and allocate, to the adjacent mounting points, a rank having the greatest number of remaining mounting points per rank among non-redundant ranks. In this case, when the rank having the greatest number of remaining mounting points per rank is not selected, the control unit 113 may allocate a random rank that is not redundant to four points adjacent up, down, left, and right.

Referring to FIG. 7, the control unit 113 may determine the ranks of the light-emitting devices each mounted at the plurality of respective mounting points by determining the rank pattern. An example of a result of determining a rank in the unit of a block group by the rank determination device 110 is shown in FIG. 8.

Figure 8:
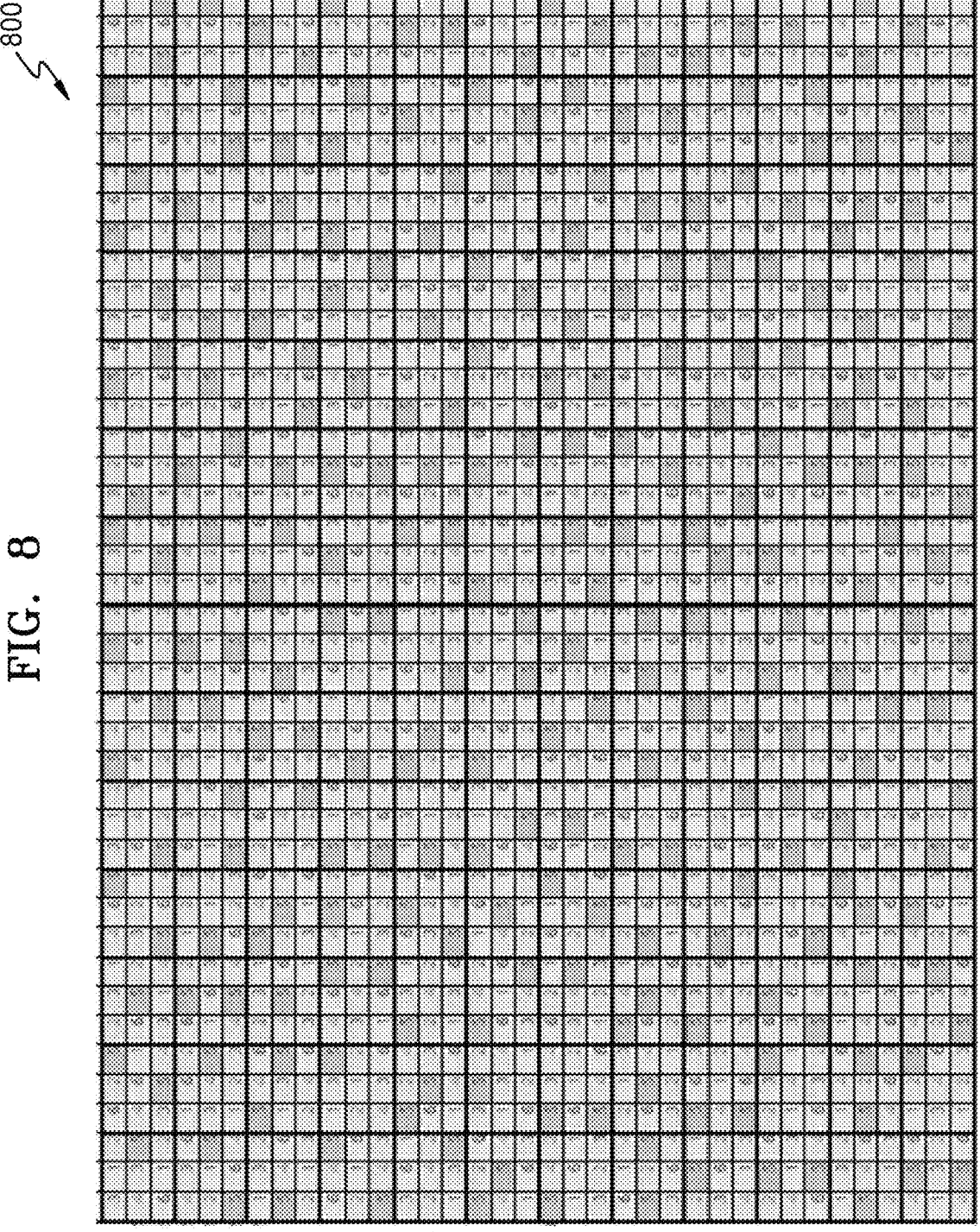
FIG. 8 shows an example of a result of determining a rank in the unit of a block group, in a rank determination system according to various embodiments of the present disclosure.

FIG. 8 shows an example 800 of a result where a rank is determined in the unit of a block group, in a rank determination system according to various embodiments of the present disclosure.

Referring to FIG. 8, an example of a rank determination result generated by the rank determination device 110 for a block size of (3, 3) and a rank type number of 6 is shown. The rank determination device 110 may determine ranks for mounting points arranged on the BLU substrate to minimize overlap between adjacent mounting points and evenly distribute the ranks randomly, by using a block group. When the block size and the rank type number are input from the user, the rank determination device 110 may generate a random pattern by variously configuring blocks in a vertical or horizontal shape.

Figure 9:
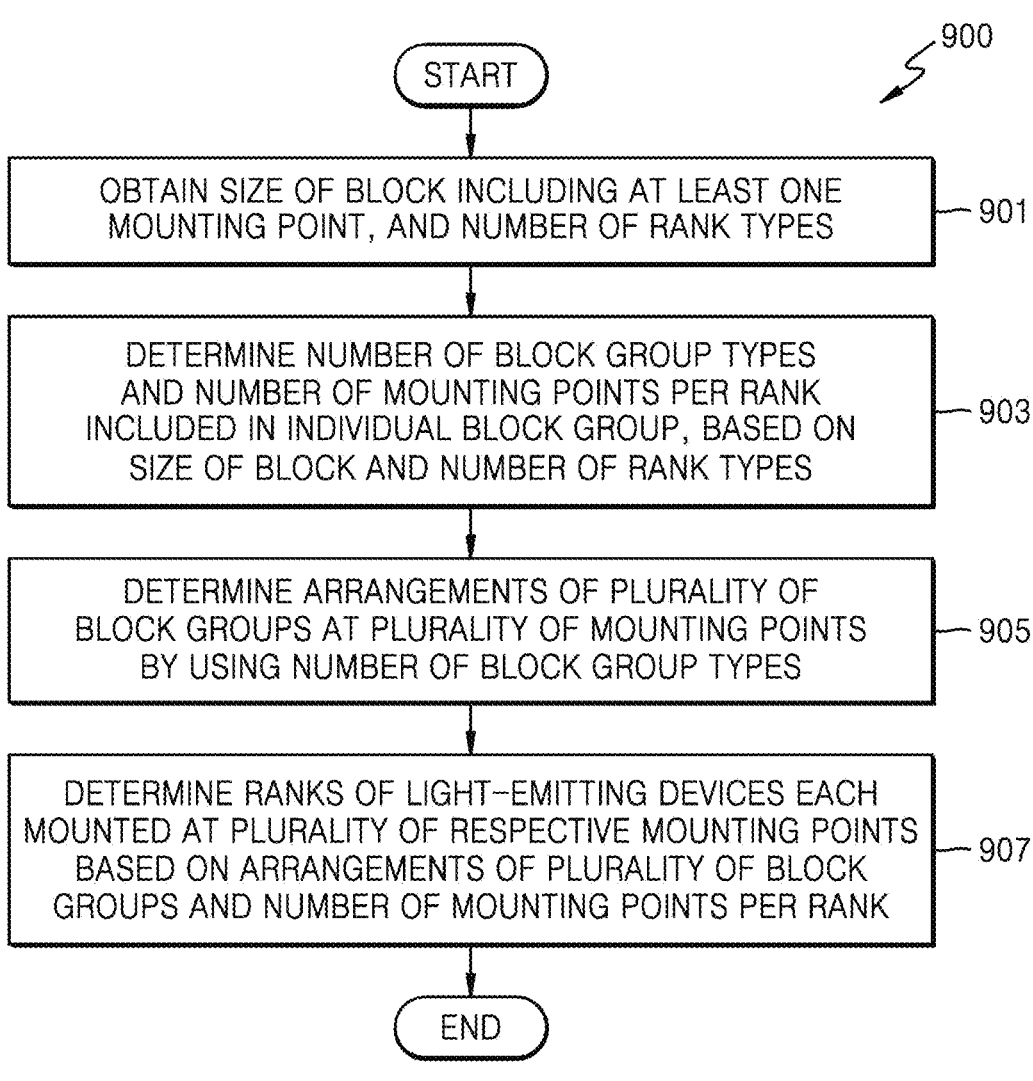
FIG. 9 is a flowchart of an operating method of a rank determination device, in a rank determination system according to various embodiments of the present disclosure.

FIG. 9 is a flowchart 900 of an operating method of the rank determination device 100, in a rank determination system according to various embodiments of the present disclosure.

Referring to FIG. 9, in operation 901, the rank determination device 110 may obtain a size of a block including at least one mounting point, and the number of rank types. The rank determination device 110 may receive at least one information among the size of the block and the number of rank types from the user. In this case, information not received from the user by the rank determination device 110 may be obtained from the memory 115 of the rank determination device 110. According to an embodiment of the present disclosure, the size of the block may include the number of X-axis mounting points and the number of Y-axis mounting points at the plurality of mounting points.

In operation 903, the rank determination device 110 may determine the number of block group types and the number of mounting points per rank included in an individual block group, based on the size of the block and the number of rank types. The rank determination device 110 may determine the number of block group types and the number of mounting points per rank in an individual block group by using the number of X-axis mounting points, the number of Y-axis mounting points, and the number of rank types of a block. According to an embodiment of the present disclosure, the rank determination device 110 may determine a value as the number of block group types such that a remainder of division of a product of the number of mounting points determined from the size of the block and the number of block group types by the number of rank types is 0.

According to an embodiment of the present disclosure, the rank determination device 110 may determine, as the number of mounting points per rank, a value obtained by dividing a product of the number of mounting points determined from the size of the block and the number of block group types by the number of rank types. In this case, the number of mounting points allocated to the first rank in an individual block group may be determined such that a difference between the number of mounting points allocated to the first rank and the number of mounting points allocated to the other rank than the first rank is less than the preset first threshold value.

In operation 905, the rank determination device 110 may determine arrangements of a plurality of block groups at a plurality of mounting points by using the number of block group types. The rank determination device 110 may determine the arrangements of the plurality of block groups at the plurality of mounting points arranged on the BLU substrate. According to an embodiment of the present disclosure, the rank determination device 110 may arrange the first block group at the plurality of mounting points based on a size of a block group and arrange the second block group different from the first block group in a block group region adjacent to a region of the first block group.

In operation 907, the rank determination device 110 may determine ranks of light-emitting devices each mounted at the plurality of respective mounting points, based on the arrangements of the plurality of block groups and the number of mounting points per rank. According to an embodiment of the present disclosure, the rank determination device 110 may allocate a rank determined according to the number of remaining mounting points per rank allocatable to one block group to a rank of light-emitting devices corresponding to mounting points where the block group is arranged, based on the number of rank types.

According to an embodiment of the present disclosure, the rank determination device 110 may allocate a rank by using a rank determined randomly at a mounting point per rank of a block group, when the number of rank types is less than or equal to the second threshold value. Herein, the second threshold value may include 2.

According to an embodiment of the present disclosure, when the number of rank types is greater than the second threshold value and is less than or equal to the third threshold value, the rank determination device 110 may allocate a rank such that light-emitting devices of the same rank are not arranged at mounting points adjacent to a mounting point up, down, left, and right. The rank determination device 110 may allocate the first rank to the light-emitting device corresponding to the first mounting point among the mounting points where the block group is arranged, and allocate, to a rank of parts corresponding to mounting points adjacent to the first mounting point, a rank having the greatest number of remaining mounting points per rank among the other ranks different from the first rank. Herein, the third threshold value may include 5.

According to another embodiment of the present disclosure, when the number of rank types exceeds the third threshold value, the rank determination device 110 may allocate a rank such that light-emitting devices of the same rank are not arranged at the mounting points adjacent to one mounting point up, down, left, and right and mounting points diagonally adjacent to the one mounting point. The rank determination device 110 may allocate the first rank to the light-emitting device corresponding to the first mounting point among the mounting points where the block group is arranged, and allocate, to the mounting points adjacent to the first mounting point and the mounting points diagonally adjacent to the first mounting point, the greatest number of remaining mounting points per rank among the other ranks different from the rank of the first mounting point. Thereafter, the rank determination device 110 may transmit information about rank allocation for a light-emitting device to at least one of a mounting device and an external device.

The methods according to examples described in the claims or specification of the disclosure may be implemented by hardware, software, or a combination thereof.

When the methods are implemented by software, a computer-readable storage medium having stored therein one or more programs (software modules) may be provided. The one or more programs stored in the computer-readable storage medium may be configured for execution by one or more processors in an electronic device. The one or more programs include instructions that cause the electronic device to execute the methods according to the examples described in the claims or the specification of the disclosure.

These programs (software modules and software) may be stored in random access memories (RAMs), non-volatile memories including flash memories, read only memories (ROMs), electrically erasable programmable ROMs (EEPROMs), magnetic disc storage devices, compact disc-ROMs (CD-ROMs), digital versatile discs (DVDs), other types of optical storage devices, or magnetic cassettes. The programs may be stored in a memory configured by a combination of some or all of such storage devices. Also, each of the memories may be provided in plurality.

The programs may be stored to an attachable storage device of the electronic device accessible via the communication network such as Internet, Intranet, a local area network (LAN), a wide area network (WAN), or storage area network (SAN), or a communication network by combining the networks. The storage device may access a device performing an example of the disclosure through an external port. In addition, a separate storage device on a communication network may access a device performing an example of the disclosure.

In the above-described detailed examples of the disclosure, components included in the disclosure have been expressed as singular or plural according to the provided detailed examples of the disclosure. However, singular or plural expressions have been selected properly for a condition provided for convenience of a description, and the disclosure is not limited to singular or plural components and components expressed as plural may be configured as a single component or a component expressed as singular may also be configured as plural components.

Meanwhile, in the detailed description of the present disclosure, specific embodiments have been described, but various modifications are possible without departing from the scope of the present disclosure. Therefore, the scope of the present disclosure should not be determined by the described examples, and should be determined by the claims and equivalents thereto as well as the claims described below.

The invention claimed is:

1. A method of determining ranks of light-emitting devices each mounted at a plurality of respective mounting points on a substrate, the method comprising:
   obtaining a size of a block comprising at least one mounting point and obtaining a number of rank types;
   determining a number of block group types and a number of mounting points per rank included in an individual block group;
   determining, by using the number of block group types, arrangements of a plurality of block groups at the plurality of mounting points; and
   determining the ranks of the light-emitting devices each mounted at the plurality of respective mounting points based on the arrangements of the plurality of block groups and the number of mounting points per rank.

2. The method of claim 1, wherein the determining of the number of block group types comprises determining a value as the number of block group types such that a remainder of division of a product of the number of mounting points determined from the size of the block and the number of block group types by the number of rank types is 0.

3. The method of claim 2, wherein the determining of the number of mounting points per rank comprises determining, as the number of mounting points per rank, a value obtained by dividing the product of the number of mounting points determined from the size of the block and the number of block group types by the number of rank types,
   wherein a number of mounting points allocated to a first rank in the individual block group is determined such that a difference between the number of mounting points allocated to the first rank and a number of mounting points allocated to ranks other than the first rank is less than a preset first threshold value.

4. The method of claim 1, wherein the determining of the arrangements of the plurality of block groups comprises:
   arranging a first block group at the plurality of mounting points based on a size of the first block group; and
   arranging a second block group that is different from the first block group in a block group region adjacent to a region of the first block group.

5. The method of claim 4, wherein the determining of the ranks of the light-emitting devices each mounted at the plurality of respective mounting points comprises allocating, based on the number of rank types to a light-emitting device corresponding to mounting points at which a corresponding block group is arranged, a rank determined according to a number of remaining mounting points per rank allocatable to the corresponding block group.

6. The method of claim 5, wherein, when the number of rank types is less than or equal to a second threshold value, the allocating of the rank comprises allocating the rank by using a rank determined randomly within a number of mounting points per rank of the corresponding block group.

7. The method of claim 6, wherein, when the number of rank types is greater than the second threshold value and is less than or equal to a third threshold value, the allocating of the rank comprises:
   allocating a first rank to a light-emitting device corresponding to a first mounting point among the mounting points at which the corresponding block group is arranged; and
   allocating, to light-emitting devices corresponding to mounting points adjacent to the first mounting point, a rank having a greatest number of remaining mounting points per rank among other ranks different from the first rank.

8. The method of claim 7, wherein, when the number of rank types is greater than the third threshold value, the allocating of the rank comprises:
   allocating a first rank to a light-emitting device corresponding to a first mounting point among the mounting points at which the corresponding block group is arranged; and
   allocating, to light-emitting devices corresponding to mounting points adjacent to the first mounting point and mounting points diagonally adjacent to the first mounting point, a rank having a greatest number of remaining mounting points per rank among other ranks different from the rank of the first mounting point.

9. The method of claim 4, wherein the first block group comprises a first sub block group and a second sub block group, and a first rank pattern of mounting points at which the first sub block group is arranged and a second rank pattern of mounting points at which the second sub block group is arranged are different from each other.

10. A rank determination device for determining ranks of light-emitting devices each mounted at a plurality of respective mounting points on a substrate, the rank determination device comprising a controller, wherein the controller is configured to:

determine a number of block group types and a number of mounting points per rank included in an individual block group;

determine, by using the number of block group types, arrangements of a plurality of block groups at the plurality of mounting points; and determine the ranks of the light-emitting devices each mounted at the plurality of respective mounting points based on the arrangements of the plurality of block groups and the number of mounting points per rank.

11. The rank determination device of claim 10, wherein the controller is further configured to determine a value as the number of block group types such that a remainder of division of a product of the number of mounting points determined from the size of the block and the number of block group types by the number of rank types is 0.

12. The rank determination device of claim 11, wherein the controller is further configured to determine, as the number of mounting points per rank, a value obtained by dividing the product of the number of mounting points determined from the size of the block and the number of block group types by the number of rank types, wherein a number of mounting points allocated to a first rank in the individual block group is determined such that a difference between the number of mounting points allocated to the first rank and a number of mounting points allocated to ranks other than the first rank is less than a preset first threshold value.

13. The rank determination device of claim 10, wherein the controller is further configured to:

arrange a first block group at the plurality of mounting points based on a size of the first block group; and arrange a second block group that is different from the first block group in a block group region adjacent to a region of the first block group.

14. The rank determination device of claim 13, wherein the controller is further configured to allocate, based on the number of rank types, to a light-emitting device corresponding to mounting points at which a corresponding block group is arranged, a rank determined according to a number of remaining mounting points per rank allocatable to the corresponding block group.

15. The rank determination device of claim 14, wherein, when the number of rank types is less than or equal to a second threshold value, the controller is further configured to allocate the rank by using a rank determined randomly within a number of mounting points per rank of the corresponding block group.

16. The rank determination device of claim 15, wherein, when the number of rank types is greater than the second threshold value and is less than or equal to a third threshold value, the controller is further configured to:

allocate a first rank to a light-emitting device corresponding to a first mounting point among the mounting points at which the corresponding block group is arranged; and allocate, to light-emitting devices corresponding to mounting points adjacent to the first mounting point, a rank having a greatest number of remaining mounting points per rank among other ranks different from the first rank.

17. The rank determination device of claim 16, wherein, when the number of rank types is greater than the third threshold value, the controller is further configured to:

allocate a first rank to a light-emitting device corresponding to a first mounting point among the mounting points at which the corresponding block group is arranged; and allocate, to light-emitting devices corresponding to mounting points adjacent to the first mounting point and mounting points diagonally adjacent to the first mounting point, a rank having a greatest number of remaining mounting points per rank among other ranks different from the rank of the first mounting point.

18. The rank determination device of claim 13, wherein the first block group comprises a first sub block group and a second sub block group, and a first rank pattern of mounting points at which the first sub block group is arranged and a second rank pattern of mounting points at which the second sub block group is arranged are different from each other.

* * * * *